(12) United States Patent
Nogami et al.

(10) Patent No.: US 9,252,887 B2
(45) Date of Patent: Feb. 2, 2016

(54) OPTICAL RECEIVER, STATION-SIDE OPTICAL NETWORK UNIT, AND LIGHT RECEPTION LEVEL MONITORING METHOD

(75) Inventors: Masamichi Nogami, Tokyo (JP);
Satoshi Yoshima, Tokyo (JP); Masaki Noda, Tokyo (JP); Junichi Nakagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 91 days.

(21) Appl. No.: 14/354,293

(22) PCT Filed: Jan. 25, 2012

(86) PCT No.: PCT/JP2012/051548
§ 371 (c)(1),
(2), (4) Date: Apr. 25, 2014

(87) PCT Pub. No.: WO2013/111286
PCT Pub. Date: Aug. 1, 2013

(65) Prior Publication Data
US 2015/0295659 A1     Oct. 15, 2015

(51) Int. Cl.
*H04B 10/06*     (2006.01)
*H04B 10/08*     (2006.01)
*H04B 17/00*     (2015.01)
(Continued)

(52) U.S. Cl.
CPC ............... *H04B 10/60* (2013.01); *H04B 10/27* (2013.01); *H04J 14/08* (2013.01)

(58) Field of Classification Search
CPC ........ H04B 10/00; H04B 10/60; H04B 10/27; H04J 14/08
USPC ................. 398/212, 209, 38, 202; 250/214 R
See application file for complete search history.

(56) References Cited

U.S. PATENT DOCUMENTS 4,550,254 A * 10/1985 Zomorrodi ........... G01N 21/274
  250/252.1
6,055,283 A *  4/2000 Rybicki .............. H04L 25/4902
  330/282

(Continued)

FOREIGN PATENT DOCUMENTS

JP     63-104384     5/1988
JP     04-348235    12/1992
(Continued)

OTHER PUBLICATIONS

International Search Report issued Feb. 21, 2012, in PCT/JP12/051548, filed Jan. 25, 2012.

*Primary Examiner* — Ken Vanderpuye
*Assistant Examiner* — Abbas H Alagheband
(74) *Attorney, Agent, or Firm* — Oblon, McClelland, Maier & Neustadt, L.L.P.

(57) ABSTRACT

An optical receiver includes a light receiving element configured to convert an input light signal into an electric current, a current mirror circuit including a reference current side transistor and a mirror current side transistor, the transistor being connected to the light receiving element, a current-voltage conversion circuit configured to convert an output current from the transistor into a voltage and output the voltage as a light reception level monitor voltage of the light receiving element, and a current sink circuit connected to the transistor and configured to feed an electric current to the transistor.

7 Claims, 13 Drawing Sheets

(51) Int. Cl.
*H01J 40/14* (2006.01)
*H01F 3/08* (2006.01)
*H04B 10/60* (2013.01)
*H04B 10/27* (2013.01)
*H04J 14/08* (2006.01)

(56) References Cited

U.S. PATENT DOCUMENTS

| | | | |
|---|---|---|---|
| 6,333,804 B1 * | 12/2001 | Nishiyama | H04B 10/69 250/214 A |
| 6,888,123 B2 * | 5/2005 | Douma | H04B 10/0799 250/214 R |
| 7,103,288 B2 * | 9/2006 | Wang | H04B 10/66 250/214 R |
| 7,217,914 B2 * | 5/2007 | Stewart | H04B 10/6931 250/214 R |
| 7,315,095 B2 | 1/2008 | Kagemoto et al. | |
| 7,676,152 B2 * | 3/2010 | Yamabana | H04B 10/07955 250/214 A |
| 7,714,269 B2 * | 5/2010 | Yoshikawa | G11B 7/13 250/214 R |
| 8,305,011 B2 | 11/2012 | Kitagawa et al. | |
| 8,369,715 B2 * | 2/2013 | Yang | H04B 10/03 398/209 |
| 8,520,199 B2 * | 8/2013 | Murayama | G01J 1/44 356/218 |
| 8,901,474 B2 * | 12/2014 | Azadeh | H04B 10/40 250/214 A |
| 2003/0029991 A1 * | 2/2003 | Hayami | H04B 10/69 250/214 R |
| 2004/0222360 A1 * | 11/2004 | Douma | H04B 10/0799 250/214 R |
| 2005/0001152 A1 * | 1/2005 | Stewart | H04B 10/6931 250/214 R |
| 2005/0006567 A1 * | 1/2005 | Stewart | H04B 10/6931 250/214 R |
| 2005/0012698 A1 | 1/2005 | Takahashi et al. | |
| 2005/0271101 A1 * | 12/2005 | Diaz | H01S 5/042 372/38.02 |
| 2006/0157646 A1 * | 7/2006 | Uchida | H04B 10/66 250/214 R |
| 2007/0108373 A1 * | 5/2007 | Zhao | H01L 27/14609 250/214.1 |
| 2007/0247533 A1 * | 10/2007 | Hisamatsu | H04N 5/185 348/257 |
| 2008/0031635 A1 | 2/2008 | Tohgoh et al. | |
| 2008/0138092 A1 * | 6/2008 | Nagakubo | H04B 10/6911 398/202 |
| 2008/0197890 A1 | 8/2008 | Yoshikawa et al. | |
| 2009/0242734 A1 | 10/2009 | Tamegai et al. | |
| 2010/0221000 A1 * | 9/2010 | Yang | H04B 10/03 398/38 |
| 2012/0217381 A1 * | 8/2012 | Tatsumi | H03F 3/087 250/214 A |
| 2013/0336650 A1 * | 12/2013 | Azadeh | H04B 10/40 398/38 |
| 2014/0361151 A1 * | 12/2014 | Nomura | H03F 3/087 250/214 R |

FOREIGN PATENT DOCUMENTS

| | | |
|---|---|---|
| JP | 09-159739 | 6/1997 |
| JP | 11-040840 | 2/1999 |
| JP | 2001-154160 | 6/2001 |
| JP | 2003-163413 | 6/2003 |
| JP | 2004-022929 | 1/2004 |
| JP | 2004-289206 | 10/2004 |
| JP | 2005-031430 | 2/2005 |
| JP | 2005-064001 | 3/2005 |
| JP | 2005-203536 | 7/2005 |
| JP | 2005-318789 | 11/2005 |
| JP | 2008-205614 | 9/2008 |
| JP | 2009-016685 | 1/2009 |
| JP | 2009-194431 | 8/2009 |
| JP | 2011-165714 | 8/2011 |
| WO | 2007/043282 | 4/2007 |

* cited by examiner

OPTICAL RECEIVER, STATION-SIDE OPTICAL NETWORK UNIT, AND LIGHT RECEPTION LEVEL MONITORING METHOD

FIELD

The present invention relates to an optical receiver, a station-side optical network unit, and a light reception level monitoring method in an optical communication system.

BACKGROUND

As a system for realizing a public line network using an optical fiber, an access system optical communication system of point-to-multipoint called PON (Passive Optical Network) system has been widely used.

The PON system includes one OLT (Optical Line Terminal), which is a station-side device, and a plurality of ONUs (Optical Network Units), which are subscriber terminal devices, connected to the OLT via an optical star coupler. The PON system has advantages that economization of operation costs can be expected because the OLT and the most part of optical fibers, which are transmission lines, can be shared among a large number of ONUs, the optical star coupler, which is a passive component, does not require power supply and is easily set outdoors, and the reliability is high. Therefore, the PON system has been actively introduced in recent years as a trump card for realizing a broadband network.

For example, in a 10G-EPON (10 Gigabit-Ethernet (registered trademark) Passive Optical Network) which is capable of performing communication at transmission speed of 10 Gbit/s standardized by IEEE (Institute of Electrical and Electronic Engineers) 802.3av, a broadcast communication system by a 1.58 μm band is used in downward communication from the OLT to the ONUs. The ONUs divide transmission speed using WDM (Wavelength Division Multiplexing) filters for performing wavelength division multiplexing and extract only data addressed to the own stations in time slots allocated to the ONUs. On the other hand, in upward communication from the ONUs to the OLT, an optical wavelength 1.27 μm band is used and a time division multiplex communication system for controlling transmission timing is used to prevent data from the ONUs from colliding with one another.

In the upward communication of the PON system explained above, a light receiving unit of the OLT receives burst light signals. In the OLT, by detecting the light reception level of each of the burst light signals, there is an effect that it is possible to improve the quality of the upward communication of the PON such as communication state monitoring and presence or absence of the burst light signal. Therefore, it is necessary to detect the light reception level of each of the burst light signals. For example, Patent Literature 1 and Patent Literature 2 propose a technology for detecting a light reception level in a point-to-point system.

CITATION LIST

Patent Literature

Patent Literature 1: Japanese Patent Application Laid-open No. 11-40840

Patent Literature 2: Japanese Patent Application Laid-open No. 2004-289206

SUMMARY

Technical Problem

However, the technology disclosed in Patent Literature 1 and Patent Literature 2 has a problem in that an accurate light reception level (input signal intensity) cannot be monitored because a current mirror circuit cannot quickly follow the change in an electric current generated from a light receiving element by the burst light signals.

Specifically, in Patent Literature 1, the burst light signals from the ONUs are input to the light receiving element in such a manner as not to collide with one another. Data and clock of burst electric signals are instantaneously generated from the burst light signals by a current-voltage conversion amplifier and a data/clock generation circuit. The current mirror circuit includes a pair of transistors, bases of which are connected to each other. The collector of one transistor (a reference current side transistor) of the pair of transistors is connected to the cathode of the light receiving element. Consequently, an input current Ipdm proportional to an electric current flowing to the light receiving element is output from the collector of the other transistor (a mirror current side transistor) of the current mirror circuit. The input current Ipdm is converted into a voltage and input to a microcomputer as an input light signal intensity monitor output Vm2. The input light signal intensity monitor output Vm2 is output from the microcomputer. In Patent Literature 1, the light reception level is monitored by the input light signal intensity monitor output Vm2.

In Patent Literature 1, when a burst-like light signal is input to the light receiving element, an electric current Ipd flows from the reference current side transistor of the current mirror circuit. However, because an electric current flowing to the reference current side transistor starts to flow from 0 A, the response of the electric current Ipdm output from the mirror current side transistor decreases in speed. Therefore, the input light signal intensity monitor output Vm2 has a waveform similar to the waveform of Ipdm, and thus, input light signal intensity cannot be accurately measured.

In Patent Literature 2, there is a problem in that input light signal intensity varies depending on each sample timing at the time of analog-digital converting the input light signal intensity monitor output after voltage conversion.

The present invention has been devised in view of the above and it is an object of the present invention to obtain an optical receiver, a station-side optical network unit, and a light reception level monitoring method.

Solution to Problem

In order to solve the aforementioned problems, an optical receiver according to one aspect of the present invention is configured to include: a light receiving element configured to convert an input light signal into an electric current; a current mirror circuit including a reference current side transistor and a mirror current side transistor, the reference current side transistor being connected to the light receiving element; a current-voltage conversion circuit configured to convert an output current from the mirror current side transistor into a voltage and output the voltage as a light reception level monitor voltage of the light receiving element; and a current sink circuit connected to the reference current side transistor and configured to feed a predetermined electric current to the reference current side transistor.

Advantageous Effects of Invention

The optical receiver, the station-side optical network unit, and the light reception level monitoring method according to the present invention attain an effect that it is made possible to accurately measure input light signal intensity.

DESCRIPTION OF EMBODIMENTS

Embodiments of an optical receiver, a station-side optical network unit, and a light reception level monitoring method according to the present invention are explained in detail below based on the drawings. Note that the present invention is not limited by the embodiments.

First Embodiment

Figure 1:
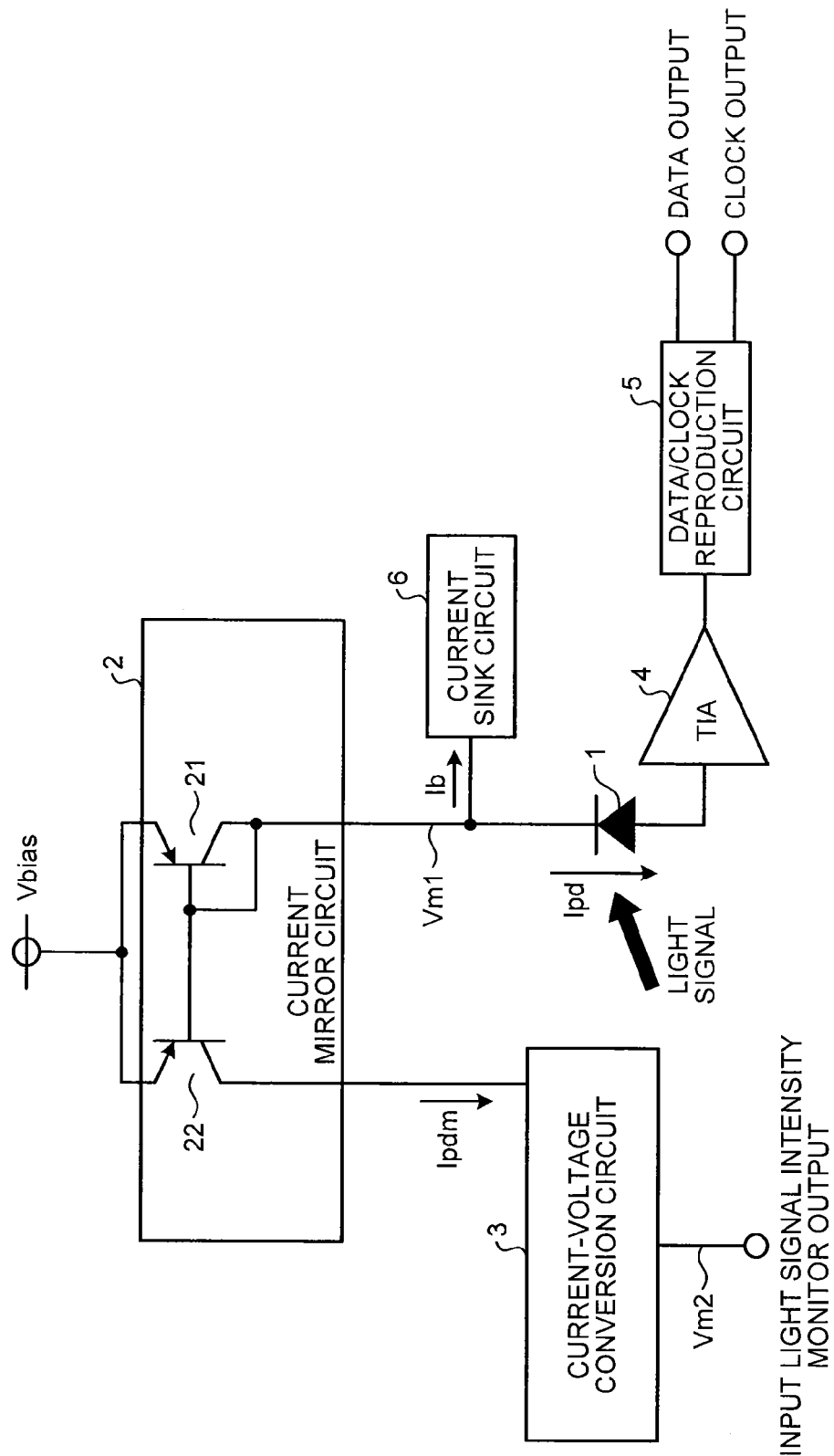
FIG. 1 is a diagram of a configuration example of an optical receiver in the first embodiment.

FIG. 1 is a diagram of a configuration example of the first embodiment of an optical receiver according to the present invention. The optical receiver in this embodiment is mounted on, for example, an OLT (a station-side optical network unit) in a PON system. Note that the optical receiver in this embodiment is not limited to be applied to the OLT and can be mounted on any apparatus as long as the apparatus is required to monitor a light reception level. An example in which the optical receiver is mounted on the OLT of the PON system is explained herein.

Figure 2:
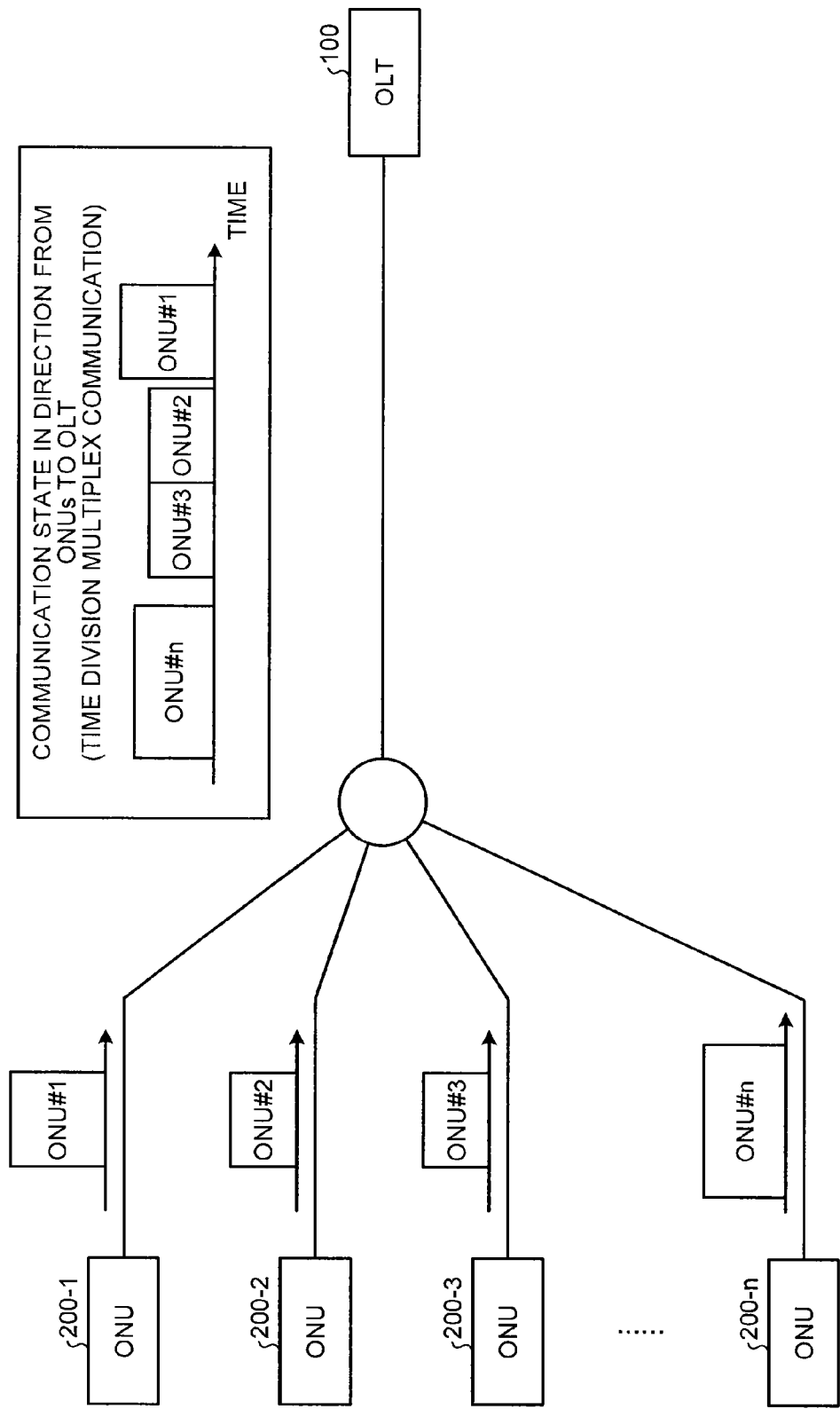
FIG. 2 is a diagram of a configuration example of a PON system including an OLT including the optical receiver.

FIG. 2 is a diagram of a configuration example of a PON system including an OLT equipped with the optical receiver in this embodiment. As shown in FIG. 2, the PON system includes an OLT 100 and ONUs 200-1 to 200-n (n is an integer equal to or larger than 1). The OLT 100 and the ONUs 200-1 to 200-n are connected by an optical fiber via a star coupler.

In the PON system, different light wavelengths are used in downward communication (communication in the direction from the OLT 100 to the ONUs 200-1 to 200-n) and upward communication (communication in the direction from the ONUs 200-1 to 200-n to the OLT 100). A broadcast communication system is used in the downward communication. A time division multiplex communication system is used in the upward communication. In the upward communication, the OLT 100 allocates transmission permission time bands to the ONUs 200-1 to 200-n so that signals transmitted from the ONUs 200-1 to 200-n do not collide with one another. Consequently, data transmitted from the ONUs 200-1 to 200-n are received in the OLT 100 as burst light signals in time bands different from one another. In FIG. 2, transmission data from ONU #i (i=1, 2, . . . , and n) is schematically shown as ONU #i.

The optical receiver in this embodiment is, for example, an optical receiver that receives a light signal in the OLT 100 shown in FIG. 2. The optical receiver receives burst light signals transmitted from the ONUs 200-1 to 200-n. As shown in FIG. 1, the optical receiver in this embodiment includes a light receiving element 1, which is a PD (Photodiode), an APD (Avalanche Photodiode), or the like, a current mirror circuit 2, a current-voltage conversion circuit 3, a current-voltage conversion amplifier (TIA) 4, a data/clock reproduction circuit 5, and a current sink circuit 6. The current mirror circuit 2 includes a transistor 21 and a transistor 22. Bases of the transistor 21 and the transistor 22 are connected to each other. The collector of the transistor 21 is connected to the cathode of the light receiving element 1.

An input burst light signal is converted into an electric current by the light receiving element 1. The current-voltage conversion amplifier 4 and the data/clock reproduction circuit 5 generate data and clock based on the electric current flowing to the light receiving element 1.

When a burst light signal is input to the light receiving element 1, an electric current Ipd flows from the light receiving element 1 to the transistor 21 of the current mirror circuit 2 according to the intensity (input signal intensity, i.e., light reception level) of the burst light signal. An electric current Ipdm proportional to the electric current flowing to the light receiving element 1 is output from the collector of the transistor 22. The current-voltage conversion circuit 3 converts the electric current Ipdm into a voltage Vm2 and outputs the voltage Vm2 as a light reception level monitor voltage (input signal intensity) of the light receiving element 1.

A light reception level monitoring method of a conventional optical receiver is explained. In the light reception level monitoring method of the conventional optical receiver, for example, a light reception level is monitored by a configuration obtained by excluding the current sink circuit 6 from the optical receiver shown in FIG. 1.

Figure 3:
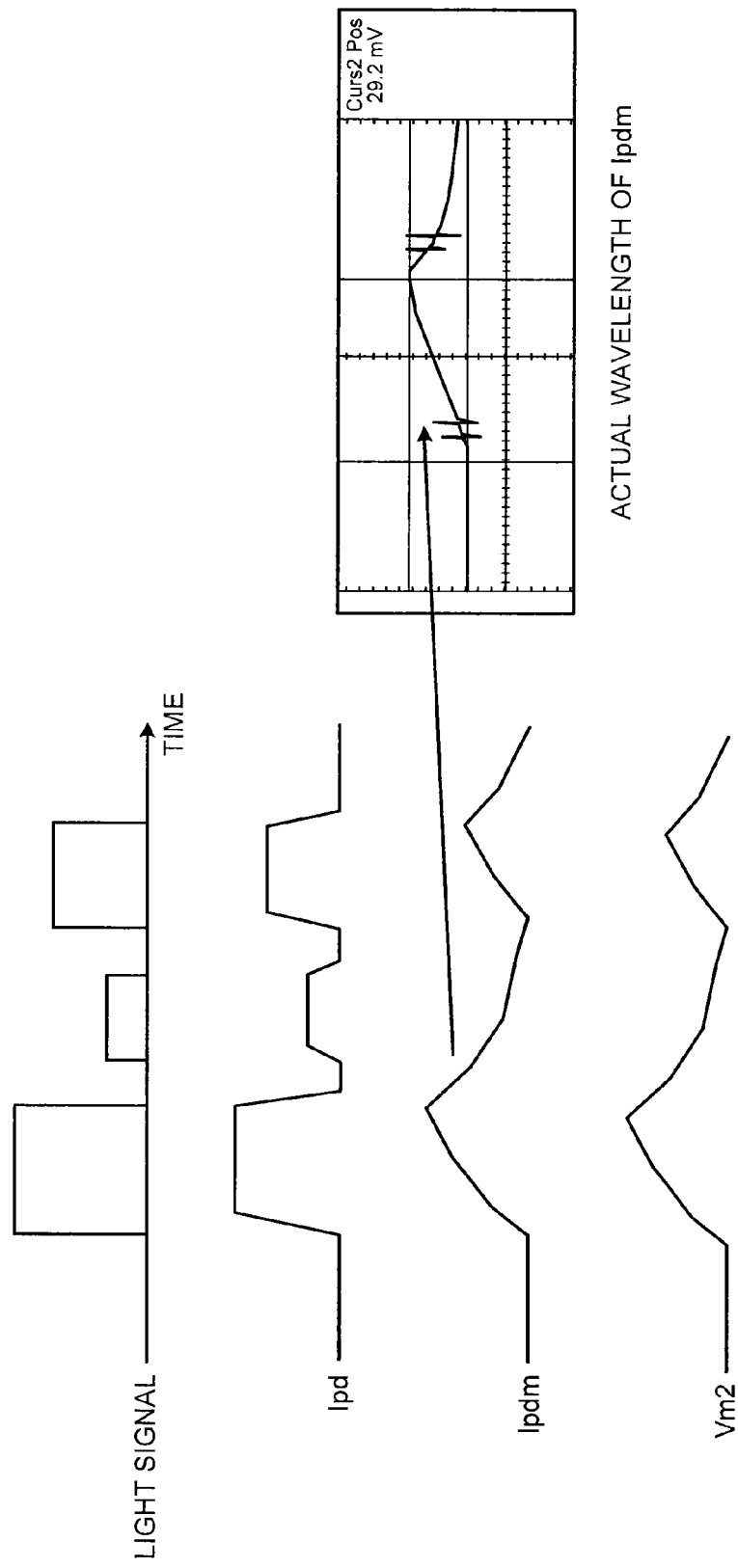
FIG. 3 is a diagram of an example of outputs in a conventional light reception level monitoring method.

FIG. 3 is a diagram of an example of outputs in the conventional light reception level monitoring method. In the conventional light reception level monitoring method, when a burst-like light signal shown in the first stage of FIG. 3 is input to the light receiving element 1, the electric current Ipd having a waveform shown in the second stage of FIG. 3 flows from the light receiving element 1 to the transistor 21 of the current mirror circuit 2. The electric current Ipdm proportional to the electric current flowing to the light receiving element 1 is output from the collector of the transistor 22. However, because an electric current flowing through the transistor 21 starts to flow from 0 A, the response of the electric current Ipdm output from the transistor 21 is likely to delay. The electric current Ipdm has a current waveform shown in the third stage of FIG. 3. A response waveform of the current Ipdm obtained when the conventional optical receiver is actually actuated is shown beside the third stage of FIG. 3. The output Vm2 of the current-voltage conversion circuit 3 shown in the fourth stage has a waveform similar to the waveform of the electric current Ipdm, and thus, input light signal intensity cannot be accurately measured.

On the other hand, in this embodiment, a constant current is steadily fed to the transistor 21 by the current sink circuit 6, whereby, upon receiving a burst light signal, the transistor 21 starts to feed the light signal current Ipd from the operating state.

Figure 4:
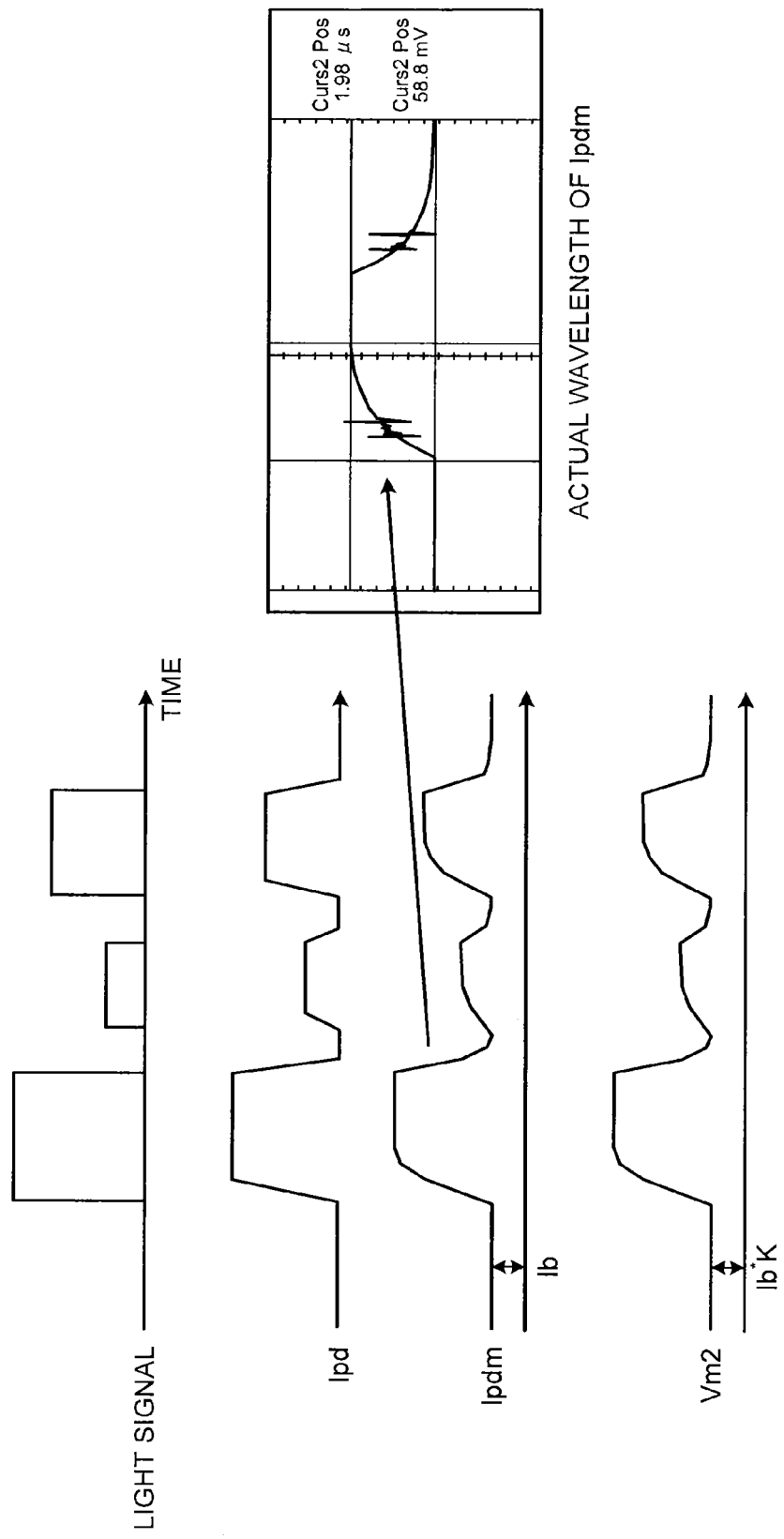
FIG. 4 is a diagram of an example of outputs in a light reception level monitoring method in the first embodiment.

FIG. 4 is a diagram of an example of outputs in the light reception level monitoring method in this embodiment. In this embodiment, when a burst-like signal is input to the light receiving element 1 as in the conventional example, an electric current having a waveform shown in the figure flows from the light receiving element 1. The electric current Ipd flows from the transistor 21, which is the reference current side transistor, of the current mirror circuit 2. The burst-like light signal in the first stage and the electric current Ipd in the second stage of FIG. 4 are the same as the burst-like light signal and the electric current Ipd in the first stage and the second stage of FIG. 3. However, in this embodiment, the constant current is steadily fed to the transistor 21 by the current sink circuit 6, whereby the transistor 21 starts to feed the electric current Ipd from the operating state. Therefore, the response of the electric current Ipdm flowing out from the transistor 22, which is the mirror current side transistor, is faster than the conventional example as shown in the third stage of FIG. 4. A response waveform obtained when the transistor 22 is actually actuated is shown on the right side of the third stage of FIG. 4.

Therefore, if the current-voltage conversion circuit 3 has a sufficient frequency response, the voltage Vm2 output from the current-voltage conversion circuit 3 has a value obtained by multiplying the electric current Ipdm with a constant, i.e., a waveform same as the waveform of the electric current Ipdm. It is possible to output accurate input light signal intensity closer to the waveform of the electric current Ipd compared with the past.

In this way, in this embodiment, the constant current is steadily fed to the transistor 21 by the current sink circuit 6, whereby, upon receiving the burst light signal, the transistor 21 starts to feed the light signal current Ipd from the operating state. Therefore, the response of the electric current Ipdm flowing out from the transistor 22 increases in speed. Further, it is possible to output accurate input light signal intensity compared with the past.

Second Embodiment

Figure 5:
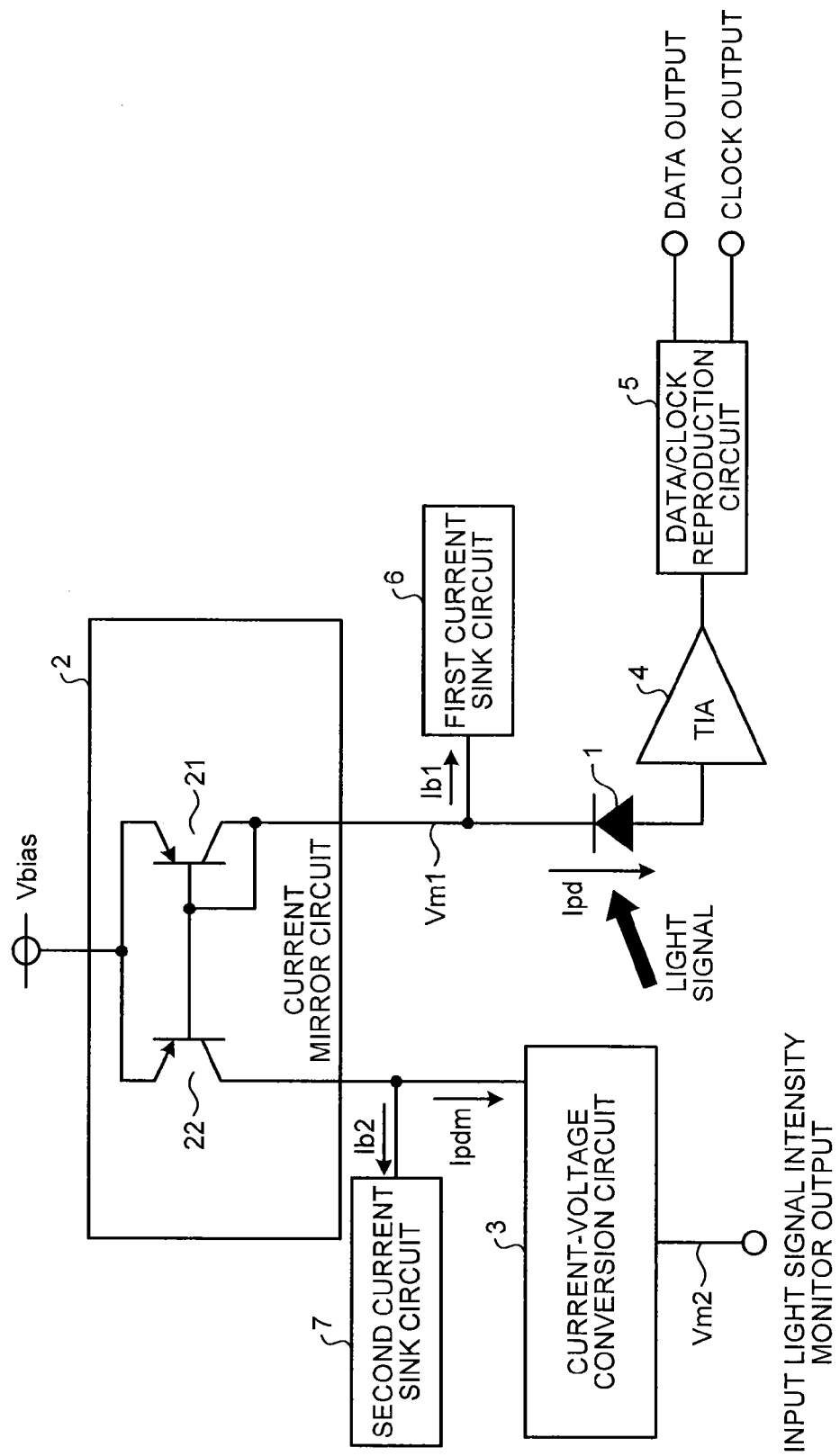
FIG. 5 is a diagram of a configuration example of an optical receiver in the second embodiment.

FIG. 5 is a diagram of a configuration example of the second embodiment of the optical receiver according to the present invention. In this embodiment, the optical receiver is the same as the optical receiver in the first embodiment except that a second current sink circuit (a mirror side current sink circuit) 7 has been added to the optical receiver in the first embodiment. In this embodiment, the current sink circuit in the first embodiment is represented as first current sink circuit 6. Components having functions same as the functions in the first embodiment are denoted by reference numerals and signs same as the reference numerals and signs in the first embodiment. Redundant explanation of the components is omitted.

Figure 6:
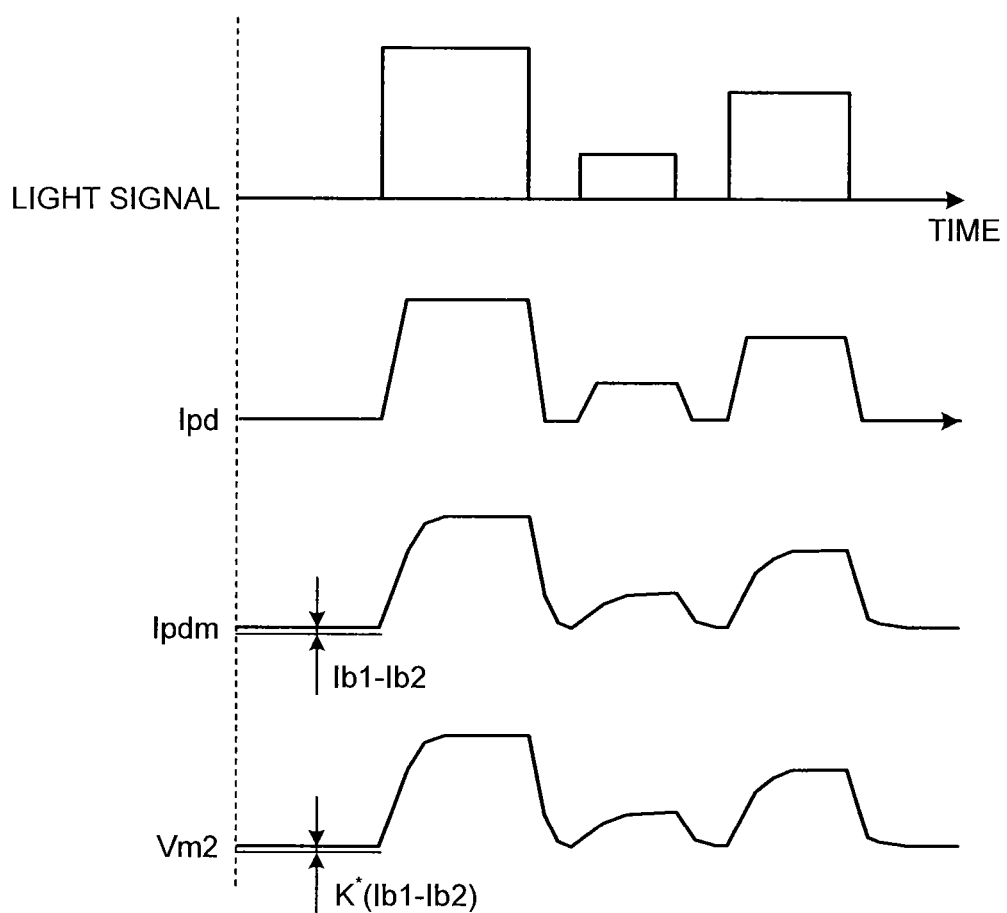
FIG. 6 is a diagram of an example of outputs in a light reception level monitoring method in the second embodiment.

FIG. 6 is a diagram of an example of outputs in a light reception level monitoring method in this embodiment. The operation in this embodiment is explained with reference to FIG. 6. The first stage and the second stage of FIG. 6 show an input burst light signal and the electric current Ipd and are the same as the first stage and the second stage of FIGS. 3 and 4 in the first embodiment. In the first embodiment, as shown in FIG. 4, an offset Ib corresponding to an electric current absorbed by the current sink circuit 6 occurs in the electric current Ipdm. An offset Ib*K (K is a constant) occurs in the voltage Vm2 according to the offset Ib. On the other hand, in this embodiment, as shown in the third stage and the fourth stage of FIG. 6, an electric current Ib2 having a value substantially the same as Ib1 is absorbed with respect to an output current from the transistor 22 by the second current sink circuit 7, whereby it is possible to cancel an offset due to the first current sink circuit 6 that occurs in Ipdm and Vm2. The operation in this embodiment other than the operation explained above is the same as the operation in the first embodiment.

As explained above, in this embodiment, an offset caused by a sink current due to the first current sink circuit 6 is cancelled by the second current sink circuit 7. Therefore, an effect same as the effect in the first embodiment is obtained. Further, it is possible to cancel the offset that occurs in the first embodiment.

Third Embodiment

Figure 7:
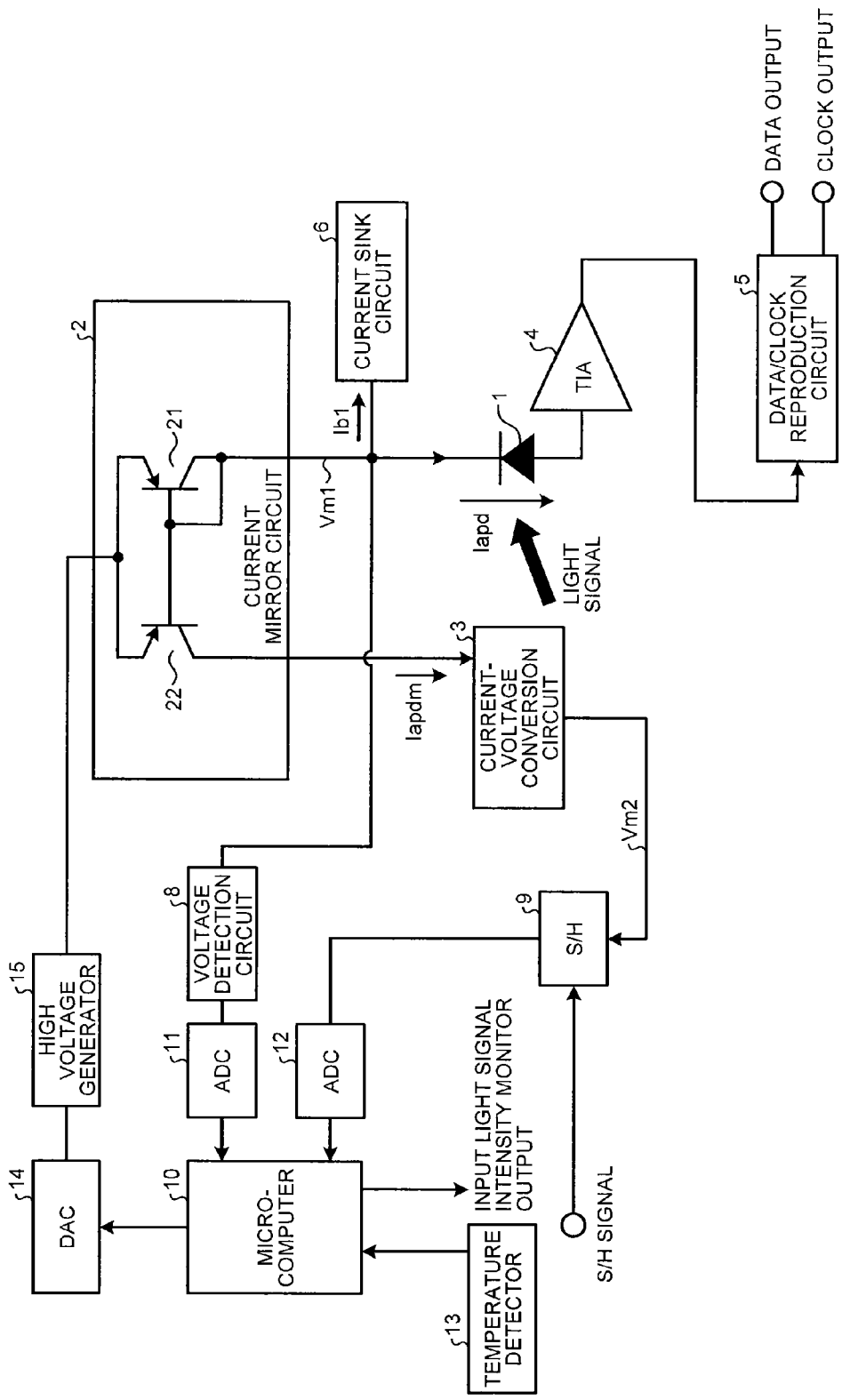
FIG. 7 is a diagram of a configuration example of an optical receiver in the third embodiment.

FIG. 7 is a diagram of a configuration example of the third embodiment of the optical receiver according to the present invention. In this embodiment, a voltage detection circuit 8, a sample & hold circuit (S/H) 9, an arithmetic circuit (a microcomputer) 10, analog-digital conversion circuits (ADCs) 11 and 12, a temperature detector 13, a digital-analog conversion circuit (DAC) 14 (a first digital-analog conversion circuit), and a high voltage generator (a voltage generator) 15 have been added to the optical receiver in the first embodiment. Components having functions same as the functions in the first embodiment are denoted by reference numerals and signs same as the reference numerals and signs in the first embodiment. Redundant explanation of the components is omitted.

In this embodiment, the operation up to outputting the voltage Vm2 as the input light signal intensity is the same as the operation in the first embodiment. However, a value of Vm2 synchronized with an S/H signal (a control signal) can be sampled by the sample & hold circuit 9, converted into digital data by the ADC 12 (a second analog-digital conversion circuit), and captured into the microcomputer 10. The high voltage generator 15 applies a voltage to the current mirror circuit 2 to give an appropriate multiplication constant to the light receiving element 1. The voltage detection circuit 8 detects an applied voltage Vapd applied to the light receiving element 1. The ADC 11 (a first analog-digital conversion circuit) converts the detected applied voltage Vapd into a digital signal and inputs the digital signal to the microcomputer 10. Consequently, the voltage Vm2 and the applied voltage Vapd to the light receiving element 1 can be captured into the microcomputer 10. An arithmetic operation can be applied to the voltage Vm2 by the microcomputer 10.

For example, when an APD is used as the light receiving element 1, the applied voltage Vapd changes depending on temperature. The voltage Vm2 does not change linearly with respect to actual input signal intensity. The characteristic representing a relation between the voltage Vm2 and the input signal intensity depends on the temperature of the light receiving element 1. Therefore, the environmental temperature of the light receiving element 1 is detected by the temperature detector 13. The voltage to be applied by the high voltage generator 15 is controlled. The microcomputer 10 applies, based on the output voltage input from the voltage detection circuit 8 and the temperature detected by the detector 13, an arithmetic operation such as correction to the voltage Vm2 using the temperature of the light receiving element 1 and outputs the voltage Vm2 as input light signal intensity (a light reception level monitor signal). Consequently, for example, even when the characteristic depends on the temperature, it is possible to output accurate input light signal intensity.

Figure 8:
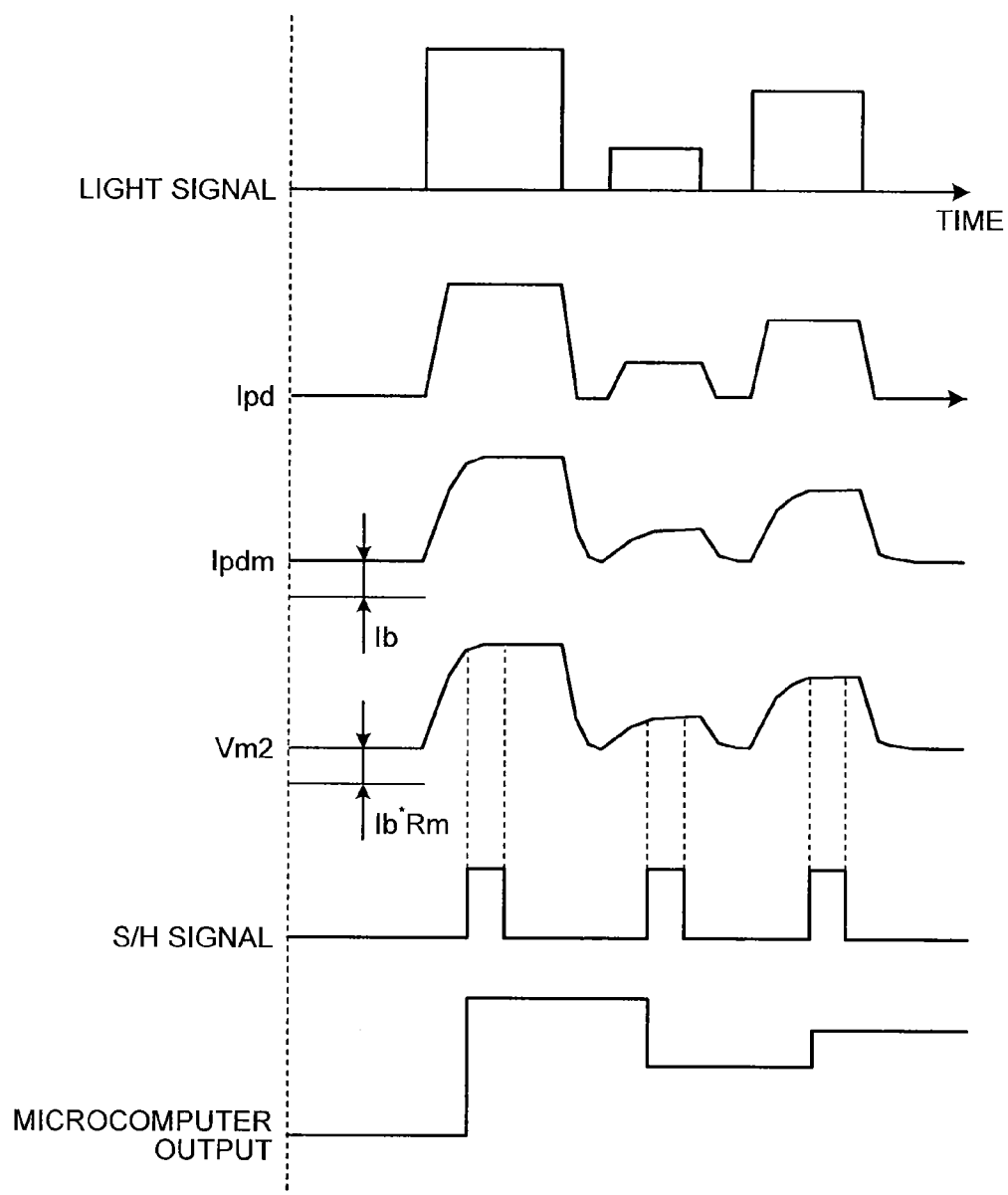
FIG. 8 is a diagram of an example of outputs in a light reception level monitoring method in the third embodiment.

FIG. 8 is a diagram of an example of a monitoring result by the light reception level monitoring method in this embodiment. The first stage, the second stage, the third stage, and the fourth stage of FIG. 8 respectively show an input burst light signal, an electric current Iapd flowing through the light receiving element 1, an electric current Iapdm flowing out from the transistor 22, and the voltage Vm2. The burst light signal, the electric current Iapd, the electric current Iapdm, and the voltage Vm2 are respectively the same as the burst light signal in the first stage, the electric current Ipd in the second stage, Ipdm in the third stage, and the voltage Vm2 in the fourth stage of FIGS. 3 and 4. An S/H signal is shown in the fifth stage of FIG. 8. An output from the microcomputer 10 is shown in the sixth stage.

As explained above, in this embodiment, the optical receiver includes the current sink circuit 6 as in the first embodiment. A value of the voltage Vm2 synchronizing with the S/H signal is sampled by the sample & hold circuit 9 and is converted into digital data by the ADC 12. Therefore, the effect same as the effect in the first embodiment is obtained. Further, it is possible to capture Vm2 into the microcomputer 10 and perform an arithmetic operation for Vm2.

Fourth Embodiment

Figure 9:
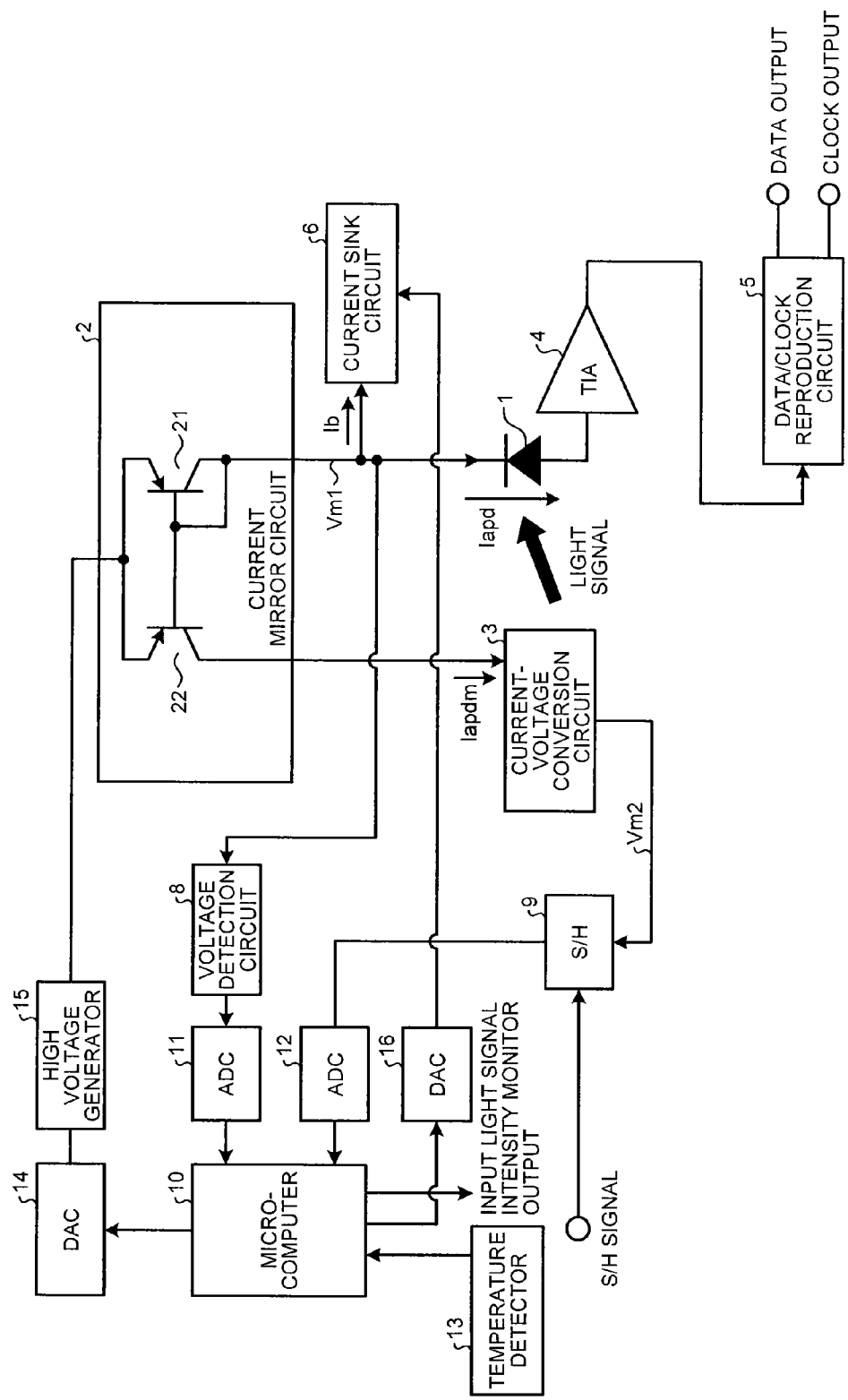
FIG. 9 is a diagram of a configuration example of an optical receiver in the fourth embodiment.

FIG. 9 is a diagram of a configuration example of the fourth embodiment of the optical receiver according to the present invention. In this embodiment, the optical receiver is the same as the optical receiver in the third embodiment except that a DAC 16 (a second digital-analog conversion circuit) has been added to the optical receiver in the third embodiment. Components having functions same as the functions in the third embodiment are denoted by reference numerals and signs same as the reference numerals and signs in the first third embodiment. Redundant explanation of the components is omitted.

In this embodiment, the microcomputer 10 changes the current amount absorbed by the current sink circuit 6 and determines an optimum current amount with respect to sampling timing of an S/H signal. The DAC 16 converts a current absorption amount of the current sink circuit 6 output from the microcomputer 10 into an analog signal and inputs the analog signal to the current sink circuit 6. When the absorption amount of the current sink circuit 6 increases, response speed to a burst light signal increases. On the other hand, when the absorption amount of the current sink circuit 6 excessively increases, an offset amount increases. Therefore, the microcomputer 10 sets, for the current sink circuit 6, an optimum current amount with respect to the sampling timing.

Figure 10:
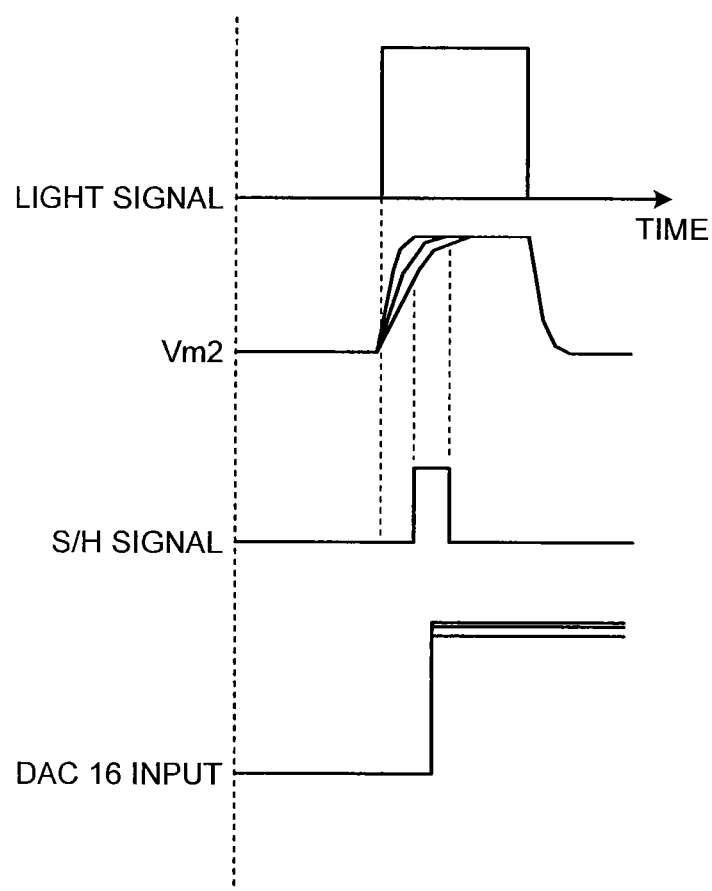
FIG. 10 is a diagram of an example of outputs in a light reception level monitoring method in the fourth embodiment.

FIG. 10 is a diagram showing an example of a monitoring result by the light reception level monitoring method in this embodiment. The first stage of FIG. 10 shows an example of an input burst light signal. The second stage shows the voltage Vm2 obtained in the same manner as in the third embodiment. As the voltage Vm2, three kinds of patterns in which response speeds are different (current absorption amounts of the current sink circuit 6 are different) are shown. The third stage shows an example of the S/H signal. The fourth stage shows three kinds of outputs from the microcomputer 10 corresponding to the three kinds of Vm2. In this way, a value output from the microcomputer 10 is different depending on the sampling speed and the response speed. Therefore, at this sampling timing, a current absorption amount is set such that Vm2 with high response speed is output among the voltages Vm2. The operation in this embodiment other than the operation explained above is the same as the operation in the third embodiment.

As mentioned above, in this embodiment, the microcomputer 10 sets an optimum current amount for the current sink circuit 6 according to the sampling timing of the S/H signal. Therefore, an effect same as the effect in the third embodiment is obtained. Further, it is possible to perform more accurate input light signal intensity monitoring.

Fifth Embodiment

Figure 11:
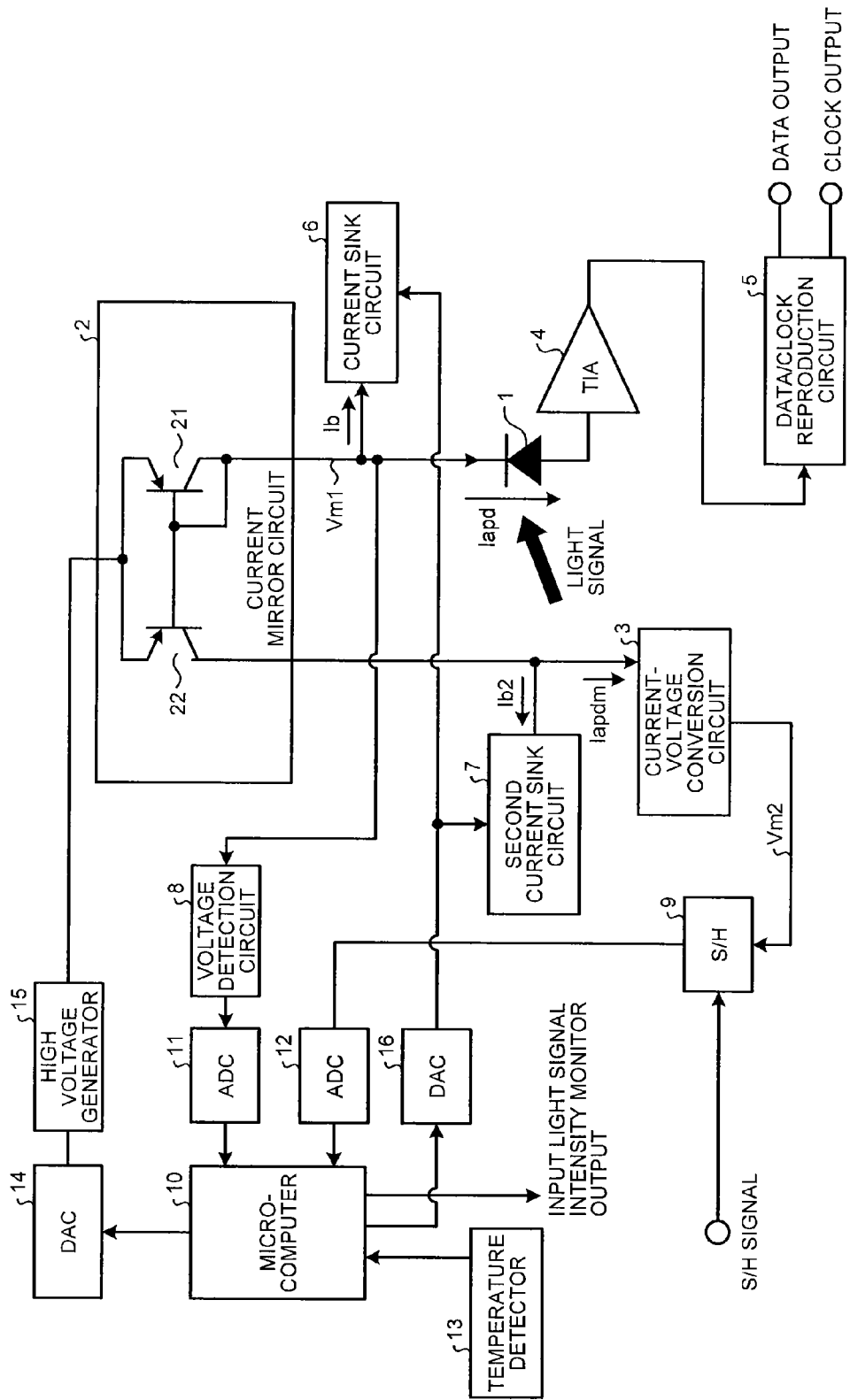
FIG. 11 is a diagram of a configuration example of an optical receiver in the fifth embodiment.

FIG. 11 is a diagram of a configuration example of the fifth embodiment of the optical receiver according to the present invention. In this embodiment, as in the second embodiment, the second current sink circuit 7 has been added to the optical receiver in the fourth embodiment. Components having functions same as the functions in the second or fourth embodiment are denoted by reference numerals and signs same as the reference numerals and signs in the second or fourth embodiment. Redundant explanation of the components is omitted.

In this embodiment, as in the fourth embodiment, the microcomputer 10 sets, for the first current sink circuit 6, an optimum sink current with respect to sampling timing of an S/H signal and sets an optimum sink current for the second current sink circuit 7 in the same manner. The operation in this embodiment other than the operation explained above is the same as the operation in the second embodiment and the fourth embodiment. In this embodiment, an effect same as the effect in the fourth embodiment is obtained. Further, it is possible to cancel an offset that occurs in the in the voltage Vm2.

Sixth Embodiment

Figure 12:
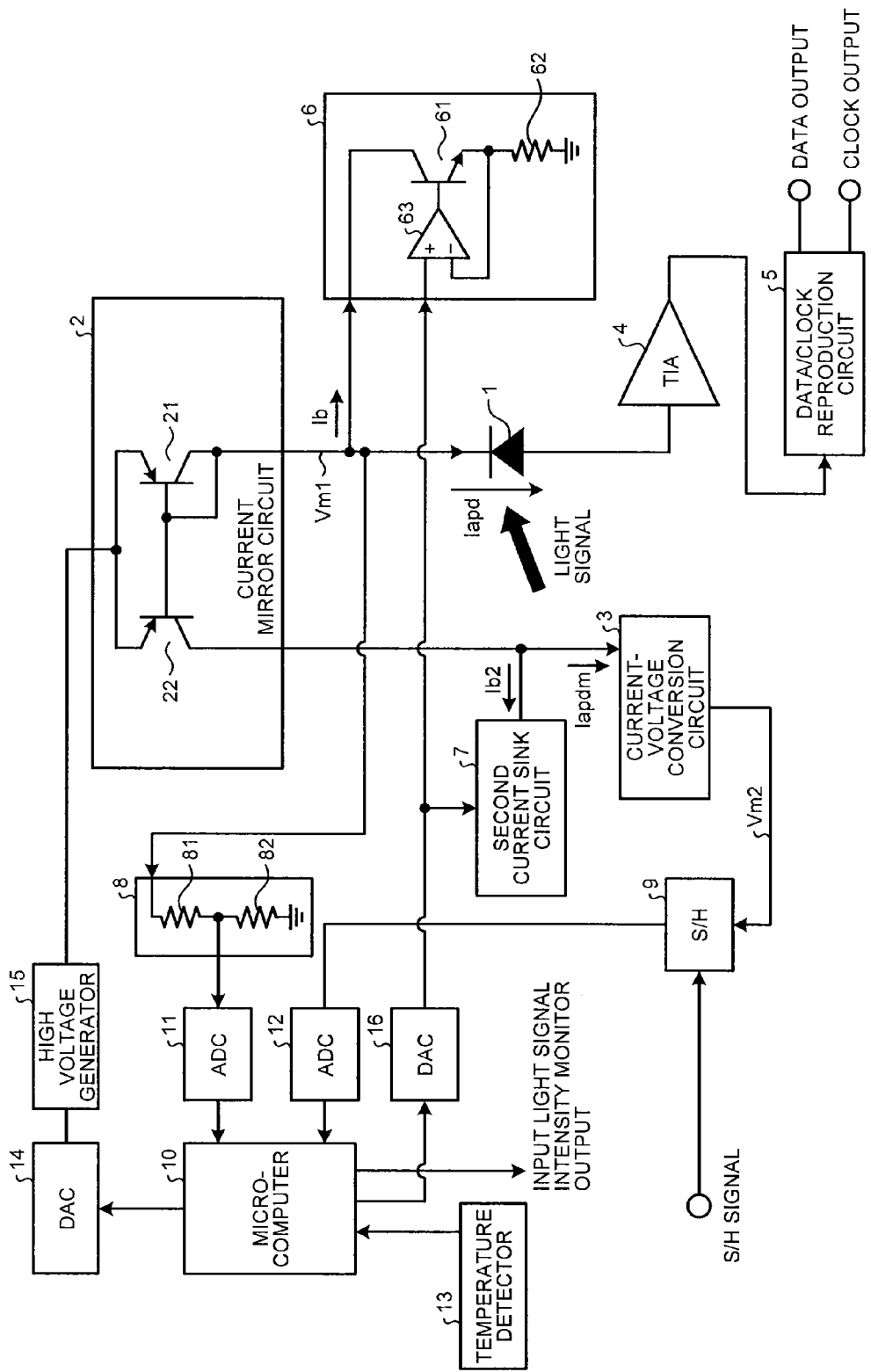
FIG. 12 is a diagram of a configuration example of an optical receiver in the sixth embodiment.

FIG. 12 is a diagram of a configuration example of the sixth embodiment of the optical receiver according to the present invention. In this embodiment, an example of the configurations of the first current sink circuit 6 and the voltage detection circuit 8 of the optical receiver in the fifth embodiment is explained. Components having functions same as the functions in the fifth embodiment are denoted by reference numerals and signs same as the reference numerals and signs in the fifth embodiment. Redundant explanation of the components is omitted.

The first current sink circuit 6 includes a transistor 61, a resistor 62, and an operational amplifier 63. The second current sink circuit 7 has a configuration same as the configuration of the first current sink circuit 6. The voltage detection circuit 8 includes resistors 81 and 82.

In this embodiment, the circuit configuration example of the first current sink circuit 6 and the voltage detection circuit 8 is shown. An effect in this embodiment is the same as the effect in the fifth embodiment.

Seventh Embodiment

Figure 13:
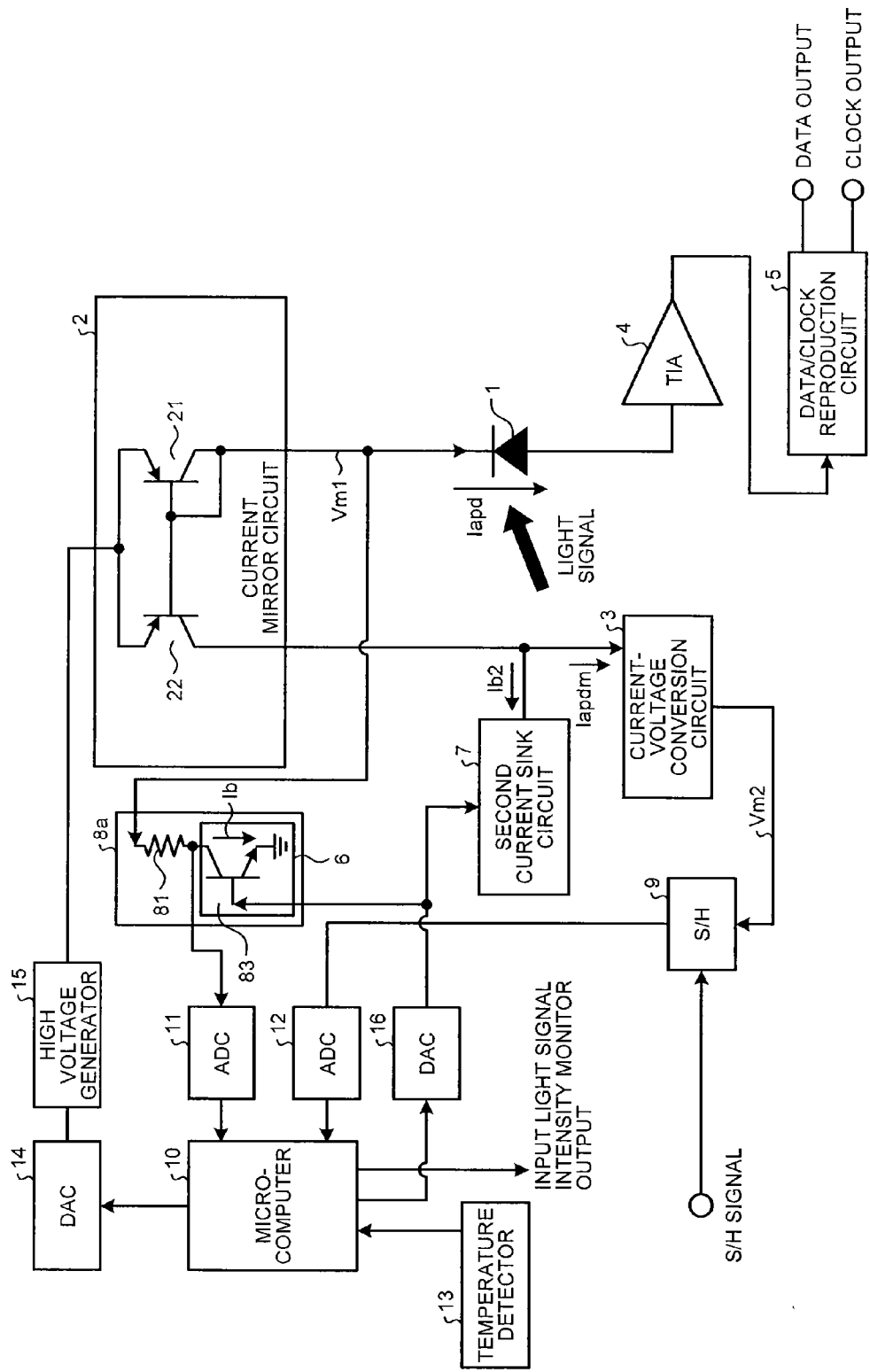
FIG. 13 is a diagram of a configuration example of an optical receiver in the seventh embodiment.

FIG. 13 is a diagram of a configuration example of the seventh embodiment of the optical receiver according to the present invention. In this embodiment, an example is explained in which the first current sink circuit 6 of the optical receiver in the fifth embodiment is provided in a voltage detection circuit 8a. Components having functions same as the functions in the fifth embodiment are denoted by reference numerals and signs same as the reference numerals and signs in the fifth embodiment. Redundant explanation of the components is omitted.

The voltage detection circuit 8a (an integrated circuit) in this embodiment is formed by integrating the first current sink circuit 6 and the voltage detection circuit 8 in the fifth embodiment. The voltage detection circuit 8a includes the resistor 81 and the first current sink circuit 6. The first current sink circuit 6 in the voltage detection circuit 8a includes a transistor 83. The resistor 81 is connected to a connection point of the reference current side of the current mirror circuit 2 and the light receiving element 1. The other side of the resistor 81 is connected to a collector of the transistor 83, which is an NPN transistor. An output of the collector of the transistor 83 is input to the ADC 11. The emitter of the transistor 83 is grounded. The base of the transistor 83 is connected to an output of the DAC 16.

When an APD is used as the light receiving element 1, the characteristic of the light receiving element 1 changes depending on an environmental temperature. Therefore, to control a multiplication constant M to be constant according to the environmental temperature (a measurement value of the temperature detector 13), it is necessary to change Vapd at respective temperatures as indicated by the following Formula (1). Note that T represents the environmental temperature, Vapd represents the applied voltage of the light receiving element 1, Vbr represents a breakdown voltage of the light receiving element 1, and n represents a coefficient determined by a device of the light receiving element 1.

$$M = \frac{1}{1 - \left(\frac{Vapd(T)}{Vbr(T)}\right)^n} \quad (1)$$

In the case of the configuration in the sixth embodiment, because a potential difference between the both ends of the resistors 81 and 82 is Vm1=Vapd, an electric current flowing through the resistor 81 changes according to temperature. Therefore, there is a problem in that an offset of input signal intensity fluctuates according to temperature.

On the other hand, in this embodiment, a current absorption amount is set for the first current sink circuit 6 in the voltage detection circuit 8a from the microcomputer 10. Consequently, it is possible to feed an optimum electric current at S/H signal timing and obtain an output voltage of the voltage detection circuit 8a without causing fluctuation in an offset of input signal intensity due to temperature.

As explained above, in this embodiment, the first current sink circuit 6 is provided in the voltage detection circuit 8a. Therefore, an effect same as the effect in the sixth embodiment is obtained. Further, it is possible to reduce fluctuation in an offset of input signal intensity due to temperature.

INDUSTRIAL APPLICABILITY

As explained above, the optical receiver, the station-side optical network unit, and the light reception level monitoring method according to the present invention are useful for a PON system and, in particular, suitable for a system that accurately measures a light reception level.

REFERENCE SIGNS LIST

1 Light receiving element
2 Current mirror circuit
3 Current-voltage conversion circuit
4 Current-voltage conversion amplifier (TIA)
5 Data/clock reproduction circuit
6 Current sink circuit, First current sink circuit
7 Second current sink circuit
8, 8a Voltage detection circuits
9 Sample & hold circuit (S/H)
10 Arithmetic circuit (microcomputer)
11, 12 Analog-digital conversion circuits (ADCs)
13 Temperature detector
14, 16 Digital-analog conversion circuits (DACs)
15 High voltage generator
21, 22, 61, 83 Transistors
62, 81, 82 Resistors
63 Operational amplifier
100 OLT
200-1 to 200-n ONUs

The invention claimed is:
1. An optical receiver comprising:
a light receiving element configured to convert an input light signal into an electric current;
a current mirror circuit including a reference current side transistor and a mirror current side transistor, the reference current side transistor being connected to the light receiving element;
a current-voltage conversion circuit configured to convert an output current from the mirror current side transistor into a voltage and output the voltage as a light reception level monitor voltage of the light receiving element;
a current sink circuit connected to the reference current side transistor and configured to feed a predetermined electric current to the reference current side transistor;
a voltage detection circuit configured to detect an applied voltage applied to the light receiving element;
a first analog digital conversion circuit configured to convert the applied voltage detected by the voltage detection circuit into a digital signal;
a sample hold circuit configured to apply, based on a control signal, sampling and hold to the light reception level monitor voltage;
a second analog-digital conversion circuit configured to convert an output from the sample hold circuit into a digital signal;
a voltage generator configured to supply a voltage to the current mirror circuit;
a temperature detector configured to detect an environmental temperature of the light receiving element;
an arithmetic circuit configured to generate, based on the digital signal output from the first analog-digital conversion circuit and the environmental temperature detected by the temperature detector, an instruction signal for instructing the voltage supplied by the voltage generator, carry out a predetermined arithmetic operation for the digital signal output from the second analog-digital conversion circuit, and output the digital signal as a light reception level monitor signal;
a digital-analog conversion circuit configured to convert the instruction signal into a digital signal and input the digital signal to the current mirror circuit; and
a second digital-analog conversion circuit configured to convert an input digital signal into an analog signal and input the analog signal to the current sink circuit,
wherein
the arithmetic circuit determines the predetermined electric current according to sampling timing of the control signal and inputs the determined predetermined electric current to the second digital-analog conversion circuit as a digital signal.

2. The optical receiver according to claim 1, wherein the current sink circuit includes:
- a transistor;
- an operational amplifier connected to a base of the transistor; and
- a resistor, one end of which is connected to an emitter of the transistor and the other end of which is grounded.

3. The optical receiver according to claim 1, wherein
the current sink circuit and the voltage detection circuit are integrated into an integrated circuit,
the integrated circuit includes a transistor and a resistor,
one end of the resistor is connected to a connection point of a reference current side of the current mirror circuit and the light receiving element and the other end of the resistor is connected to a collector of the transistor, and
the collector of the transistor is set as an input to the first analog-digital conversion circuit, the emitter of the transistor is grounded, and the base of the transistor is connected to an output of the second digital-analog conversion circuit.

4. A station-side optical network unit connected to a subscriber-side optical network unit, the station-side optical network unit and the subscriber-side optical network unit configuring a PON system, the station-side optical network unit comprising the optical receiver according to claim 1.

5. An optical receiver comprising:
- a light receiving element configured to convert an input light signal into an electric current;
- a current mirror circuit including a reference current side transistor and a mirror current side transistor, the reference current side transistor being connected to the light receiving element;
- a current-voltage conversion circuit configured to convert an output current from the mirror current side transistor into a voltage and output the voltage as a light reception level monitor voltage of the light receiving element;
- a current sink circuit connected to the reference current side transistor and configured to feed a predetermined electric current to the reference current side transistor;
- a voltage detection circuit configured to detect an applied voltage applied to the light receiving element;
- a first analog digital conversion circuit configured to convert the applied voltage detected by the voltage detection circuit into a digital signal;
- a sample hold circuit configured to apply, based on a control signal, sampling and hold to the light reception level monitor voltage;
- a second analog-digital conversion circuit configured to convert an output from the sample hold circuit into a digital signal;
- a voltage generator configured to supply a voltage to the current mirror circuit;
- a temperature detector configured to detect an environmental temperature of the light receiving element;
- an arithmetic circuit configured to generate, based on the digital signal output from the first analog-digital conversion circuit and the environmental temperature detected by the temperature detector, an instruction signal for instructing the voltage supplied by the voltage generator, carry out a predetermined arithmetic operation for the digital signal output from the second analog-digital conversion circuit, and output the digital signal as a light reception level monitor signal;
- a digital-analog conversion circuit configured to convert the instruction signal into a digital signal and input the digital signal to the current mirror circuit; and
- a second digital-analog conversion circuit configured to convert an input digital signal into an analog signal and input the analog signal to the current sink circuit, wherein
the current sink circuit and the voltage detection circuit are integrated into an integrated circuit,
the integrated circuit includes a transistor and a resistor,
one end of the resistor is connected to a connection point of a reference current side of the current mirror circuit and the light receiving element and the other end of the resistor is connected to a collector of the transistor, and
the collector of the transistor is set as an input to the first analog-digital conversion circuit, the emitter of the transistor is grounded, and the base of the transistor is connected to an output of the second digital-analog conversion circuit.

6. A station-side optical network unit connected to a subscriber-side optical network unit, the station-side optical network unit and the subscriber-side optical network unit configuring a PON system, the station-side optical network unit comprising the optical receiver according to claim 5.

7. A light reception level monitoring method for monitoring a light reception level of an optical receiver including a light receiving element configured to convert an input light signal into an electric current and a current mirror circuit including a reference current side transistor and a mirror current side transistor, the reference current side transistor being connected to the light receiving element, the light reception level monitoring method comprising:
- a current absorption step of feeding a predetermined electric current to the reference current side transistor; and
- a current-voltage conversion step of converting an output current from the mirror current side transistor into a voltage and outputting the voltage as a light reception level monitor voltage of the light receiving element;
- a voltage detection step of detecting an applied voltage applied to the light receiving element;
- a first analog digital conversion step of converting the applied voltage detected by the voltage detection circuit into a digital signal;
- a sample hold step of applying, based on a control signal, sampling and holding to the light reception level monitor voltage;
- a second analog-digital conversion step of converting an output from the sample hold circuit into a digital signal;
- a voltage generating step of supplying a voltage to the current mirror circuit;
- a temperature detecting step of detecting an environmental temperature of the light receiving element;
- an arithmetic operation step of generating, based on the digital signal output from the first analog-digital conversion circuit and the environmental temperature detected by the temperature detector, an instruction signal for instructing the voltage supplied by the voltage generator, carrying out a predetermined arithmetic operation for the digital signal output from the second analog-digital conversion circuit, and outputting the digital signal as a light reception level monitor signal;
- a digital-analog conversion step of converting the instruction signal into a digital signal and input the digital signal to the current mirror circuit; and
- a second digital-analog conversion step of converting an input digital signal into an analog signal and input the analog signal to the current sink circuit, wherein
in the arithmetic operation step, the predetermined electric current is determined according to sampling timing of the control signal and the determined predetermined electric current is made to be an input to the second digital-analog conversion step as a digital signal.

* * * * *